PROCESS FOR PREFORMING CRYSTALLINE BODIES

Filed Dec. 1, 1966

INVENTOR.
JOHN C. MARINACE

BY S. P. Tedesco

ATTORNEY 3,458,369
Patented July 29, 1969

1 2

3,458,369

PROCESS FOR PREFORMING CRYSTALLINE BODIES

John C. Marinace, Yorktown Heights, N.Y., assignor to International Business Machines Corporation, Armonk, N.Y., a corporation of New York Filed Dec. 1, 1966, Ser. No. 598,381
Int. Cl. H01l 7/32
U.S. Cl. 148—175 19 Claims

ABSTRACT OF THE DISCLOSURE

A process for cleaving a crystalline wafer by depositing over one surface of the wafer a stressing material having a coefficient of expansion different from that of the wafer and varying the temperature of the resulting laminate to cleave the wafer along its natural cleavage planes.

This invention relates to a process for forming precise spaced-parallel grooves in a host crystalline body wherein active semiconductor devices may be formed. Additionally, this invention relates to a process for forming a plurality of distinct semiconductor bodies, each having precise dimensions and wherein at least two surfaces are optically flat and crystallographically parallel.

In the semiconductor technology, it is often desirable to fabricate narrow, precise PN-junction devices in spaced-parallel relationship in a host crystalline body, e.g., semi-insulating semiconductor wafer. For example, a recent development has been the injection laser which, essentially, comprises a body of appropriate semiconductor material having a PN-junction defined therein. When current flows across the PN-junction in the forward direction, current carriers recombine in the dominant mode and coherent light is generated in a narrow optical cavity whose planar axis is defined along the PN-junction. Often, a plurality of injection lasers are batch fabricated, i.e., in integrated fashion, in a host material which not only provides support but also serves to dissipate heat from the PN-junctions. A critical parameter of injection laser performance is the threshold current $I_t$ for coherent light output which is very sensitive to change in junction temperature. $T_j$. The critical dependence of laser operation on temperature has been reported, for example, in "CW Operation of a GaAs Injection Laser" by W. E. Howard et al., IBM Journal of Research and Development, vol. VII, pages 74–75, January 1963 and, also, in "CW Operation of GaAs Injection Lasers" by M. F. La Morte et al., Proceedings of the I.E.E.E., vol. LII, No. 10, pages 1257–1258, October 1964. The power output and, also, efficiency of an injection laser can be substantially improved if variations of junction temperature $T_j$ are minimized. It has been appreciated that junction temperature $T_j$ can be substantially stabilized if the lateral dimension, or width, of the optical cavity, i.e., the PN-junction, is minimized so as to improve heat dissipation from along the PN-junction.

In the present art, narrow injection lasers are fabricated by diffusion-masking techniques. Such techniques, however, are ineffective to minimize the lateral dimensions of the PN-junctions as the dopant, or impurity, material tends to diffuse laterally under the diffusion mask. Accordingly, the resulting diffused region is semicylindrical whereby the junction profiles, or lateral, dimensions, from a heat standpoint, are excessive. Some prior art techniques attempt to minimize the lateral dimensions of the PN-junction by forming the injection laser within a depression etched into the surface of a host material. Limitations are present in such techniques since both etching and diffusion processes proceed laterally under the mask pattern. Due to the inherent limitations of prior art techniques, the lateral dimensions of the resulting PN-junctions are not minimal such as to optimize the efficiency of the resulting injection lasers.

According, it is an object of this invention to provide an improved injection laser wherein the lateral dimension of the optical cavity is minimal.

Another object of this invention is to provide an improved technique for manufacturing precise crystalline shapes.

Another object of this invention is to provide an improved process for fabricating a plurality of PN-junction devices in a host material.

Another object of this invention is to provide an improved process for forming discrete crystalline bodies having at least two optically parallel surfaces.

Another object of this invention is to provide an improved process for preforming the surface of a crystalline body in avoidance of physical masking techniques.

Another object of this invention is to provide an improved process for fabricating an array of injection lasers in a host material.

These and other objects and features of this invention are achieved by utilizing particular properties of crystalline bodies whereby advantage is taken of the natural cleavage planes defined in their lattice structures. As herein employed, the natural cleavage plane is defined as that crystallographic plane in the lattice exhibiting a minimum bond density. In accordance with particular aspects of this invention, a "stressing" layer is deposited, for example, by vapor-deposition, over a host semiconductor crystalline body, or wafer, which exhibits a smaller coefficient of linear expansion than the semiconductor body. During the deposition process, the semiconductor body is maintained at an elevated temperature. Subsequent to the deposition process and while being cooled to room temperature, the semiconductor body is stressed. Due to the differences in the respective coefficients of linear expansion, the induced stressing forces exceed the bonding forces between a particular set of natural cleavage planes. Accordingly, the semiconductor body cracks along the natural cleavage planes, the resulting fissures being parallel and optically flat. Such fissures can be utilized to preform the surface of the semiconductor body by employing appropriate etching techniques or to dissect such body into precise crystalline shapes.

Generally, crystalline bodies may be classified according to their lattice structures as diamond cubic (diamond, germanium, silicon, gray tin, etc.); zinc blende (generally, intermetallic compounds, e.g., gallium arsenide, aluminum arsenide, α-zinc sulfide, α-cadmium sulfide, indium arsenide, indium phosphide, etc., and many intermetallic compounds); and wurtzite ($\beta$-zinc sulfide, $\beta$-cadmium sulfide, etc.). The diamond cubic lattice structure is characterized by a tetrahedral bond whereby each atom is bonded to its four nearest neighbors by valence bonding; the zinc blende lattice structure is practically identical except that, since formed of a compound material, ionic as well as valence boding exists between each atom and its four nearest neighbors. The wurtzite lattice structure can be described as a closely packed hexagonal structure related to the face-centered cubic lattice but differing in the orientation of the superimposed layers of atoms therein. A more detailed description of these and other lattice structures may be had by reference, for example, to "An Introduction to Semiconductors" by W. C. Dunlap, Jr., John Wiley and Sons, Inc., 1957; and also "Modern Theory of Solids," by F. Seitz, McGraw-Hill Book Co., Inc. 1940. In the diamond cubic lattice the natural cleavage planes, or crystallographic planes of minimum bond density, are oriented along the [111] plane, the bracketed numbers being Miller indices derived by taking the reciprocal of the intercept values where the crystallographic plane intersects the three imaginary dimensional axes of the periodic atomic array of the crystal. In the zinc blende lattice structure, the natural cleavage planes are oriented along the [110] plane; in the wurtzite lattice structure, the natural cleavage planes are located in the $[11\bar{2}0]$ plane. Due to the periodicity of the crystal lattice, the natural cleavage planes are defined in parallel fashion.

In accordance with the more particular aspects of this invention, a crystalline wafer of [110] oriented semi-insulating GaAs, is coated in laminate fashion with an epitaxially grown noncontaminating layer of selected material, e.g., GaP:As, having a smaller coefficient of linear expansion. During the vapor-deposition process, the crystalline wafer is maintained at an elevated temperature, e.g., 850° C. A strong crystallographic bond exists between the crystalline wafer and the "stressing" layer due to the "seeding" process whereby the former exhibits the same atomic periodicity. Vapor-deposition processes by which the "stressing" layer can be deposited have been described, for example, in the J. C. Marinace et al. Patent No. 3,014,820 issued on Dec. 26, 1961, and, also the J. C. Marinace Patent No. 3,065,116, issued on Nov. 20, 1962, each of which has been assigned to a common assignee.

During the cooling of the laminate structure comprising the crystalline wafer and the "stressing" layer subsequent to the deposition process, "stressing" forces directed perpendicularly to the cleavage planes are sufficient to overcome the bonding forces therebetween. Accordingly, the crystalline wafer cracks along the natural cleavage [110] planes to produce spaced-parallel fissures. The laminate structure is then exposed to a selective etchant, e.g., 1:1:5 N $KOH:H_2O_2$, having a negligible effect on the "stressing" layer to preform the surface of the crystalline wafer. Due to the very minute dimensions of the fissures, cusp-like troughs are defined in the crystalline wafer. To fabricate an array of PN-junction devices, e.g., transistors, electro-luminescent diodes, injection layers etc., the spaced-parallel troughs can be "back-filled" by an impurity-rich semiconductor material and conventional diffusion practices utilized so as to define PN-junction devices within the back-filled troughs. The resultant structure, therefore, defines a plurality of PN-junction devices formed within the crystalline body.

In accordance with other aspects of this invention a crystalline semiconductor wafer of particular conductivity type and having junctions formed therein can be "split" into a plurality of distinct crystalline bodies having at least two crystallographically perfect parallel surfaces. It is evident to those skilled in the art that such parallel surfaces may define the Fabry-Perot cavity in an injection laser. To insure a complete "split," "stressing" layers can be deposited on opposite major surfaces of the crystalline wafer. Upon cooling, the crystalline wafer "splits" along the natural cleavage planes and removal of the "stressing" layer results in the separation of such wafer into distinct crystalline bodies. The resulting crystalline bodies, for example, can be cut perpendicular to the "split" surfaces whereby a plurality of injection lasers having a Fabry-Perot configuration are produced.

Also, to insure that the distinct crystalline bodies have desired dimensions, a number of depressions can be defined in the surface of the crystalline wafer and parallel to the natural cleavage planes prior to the deposition of the "stressing" layer. The on-center spacing between such depressions will determine the lateral dimensions of the distinct crystalline bodies obtained when the crystalline wafer is stressed. Since the "stressing" layer is deposited within such depressions, the crystalline wafer is most stressed and cracks along natural cleavage planes corresponding to the individual depressions.

The method of this invention is particularly advantageous over the prior art in that the "stressing" of the crystalline wafer occurs upon cooling-down subsequent to, for example, the vapor-deposition process by which the "stressing" layer is formed. Heretofore, the cooling-down period of a wafer subsequent to a vapor-deposition process has been considered "down-time." The present invention takes particular cognizance that the crystalline wafer is normally at an elevated temperature during a vapor-deposition process and advantageously utilizes such fact along with its crystallographic properties to dissect such wafer along the natural cleavage planes when a "stressing" layer having a lesser coefficient of linear expansion has been deposited thereover during such cooling period.

The foregoing and other object features, and advantages of this invention will be apparent from the following more particular description of preferred embodiments of the invention as illustrated in the accompanying drawings.

Figure 1:
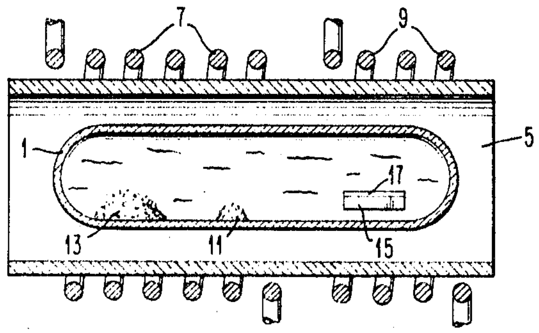
FIG. 1 illustrates a vapor-deposition system useful for epitaxially depositing a "stressing" layer on a crystalline wafer.

In the preferred practice of this invention, the "stressing" layer is deposited over the crystalline wafer by epitaxial processes. By "epitaxial process" is meant the addition, for example, by vapor-deposition, of a material to a "seeding" surface so as to exhibit a same atomic periodicity and crystalline structure as such surface. For example, such epitaxial process can be effected in the "closed-tube" system shown in FIG. 1. Such system comprises a quartz housing 1 positioned within a furnace 5 including heating coils 7 and 9 and containing a source 11 of gallium arsenide (GaAs), a source 13 of gallium phosphide (GaP), and a crystalline wafer 15 of semi-insulating GaAs. Wafer 15 exhibits a [110] orientation such that the upper exposed major surface is perpendicular to the natural cleavage planes in the lattice structure. Wafer 15 is disposed within coil 9 of furnace 5 whereas GaAs and GaP sources 11 and 13 are disposed within coil 7 of furnace 5. When energized, coil 7 causes GaAs and GaP sources 11 and 13 to vaporize, such vapors moving throughout housing 1 so as to deposit on wafer 15. For example, coil 7 elevates GaAs and GaP sources 11 and 13 to approximately 900° C. whereas coil 9 elevates wafer 15 to approximately 850° C. Under such conditions, the GaAs and GaP vapors deposit over the surface of wafer 15 to form GaP:As "stressing" layer 17. The system and mechanism for the vapor deposition of "stressing" layer 17 is, for all practical purposes, conventional. However, wafer 15 is particularly oriented such that "stressing" layer 17 deposits over a surface perpendicular to a set of minimum bond crystallographic, or cleavage, planes. As known in the art, the orientation of wafer 15 can be ascertained by known X-ray diffraction or orientation techniques.

Figures 2A, 2B, 2C, 2D, 2E, 2F:
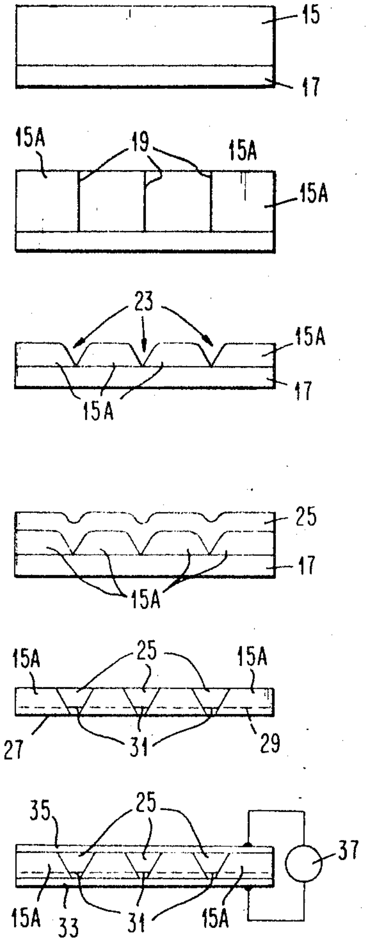
FIGS. 2A–2F illustrate the various process steps for fabricating a plurality of PN-junction devices in a host semiconductor wafer, the surface of said wafer being preformed in accordance with the principles of this invention.

The laminate structure comprising wafer 15 and "stressing" layer 17 is more particularly shown in FIG. 2A. As a result of the epitaxial deposition process, a strong bond exists between wafer 15 and "stressing" layer 17. The laminate structure of FIG. 2A, when completed, is at an elevated temperature, e.g., 850° C. By purposefully selecting "stressing" layer 17 to exhibit a smaller coefficient of linear expansion than the coefficient of linear expansion of wafer 15, wafer 15 is stressed when the laminate of FIG. 2A is cooled to room temperature. Due to the differences in the respective coefficients of linear expansion, such stressing forces are sufficient to cause wafer 15 to split along the [110] natural cleavage planes as illustrated by fissures 19 of FIG. 2B. In effect, wafer 15 is dissected into discrete bodies 15A having a pair of optically flat surfaces and which are spatially maintained since bonded to "stressing" layer 17. In accordance with the preferred method, fissures 19 are employed in the etching of precise spaced-parallel grooves, for example, to fabricate an array of infection layers by the process steps shown in FIGS. 2C through 2F.

As shown in FIG. 2C, "stressing" layer 17 is of sufficient thickness to maintain wafer 15, or bodies 15A, intact during a subsequent etching process whereby grooves 23 are defined in wafer 15. For example, the structure of FIG. 2B is exposed to an etchant selective with respect to the material of wafer 15, i.e., GaAs, but unreactive with the material of "stressing" layer 17, i.e., GaP:As. For example, an etchant comprising 1:1:5 N KOH:$H_2O$ is reactive with the GaAs wafer but is unreactive with the GaP:As "stressing" layer. Due to the minimal dimensions of the opening defined by fissures 19, etching does not proceed concurrently and uniformly along their entire depths. Rather, etching commences at the surface of wafer 15 and proceeds downwardly along fissures 19 in delayed fashion. Accordingly, parallel troughs 23 are defined in wafer 15 having respective axes precisely aligned in the [110] planes and along the [100] direction of the crystal lattice, the lateral dimensions of such troughs being dependent upon the duration of the etching process. The cross section of troughs 23 is not semi-cylindrical as in the case of conventional etching techniques employing physical masks; rather, the cross section of troughs 23 is substantially triangular having slightly cusped-shaped walls whereby the width dimensions of the bottoms are determined by the duration of the etching process. The resulting cross section of troughs 23 is preferred since the lateral dimensions of PN-junction diffused from the opposite surface of wafer 15, as hereinafter described, are very substantially reduced.

To fabricate an array of injection lasers, troughs 23 are "back-filled" by an epitaxial growth 25, for example, of n-type GaAs, or a similar epitaxially compatible material as shown in FIG. 2D. The back-filling of troughs 23 by n-type GaAs material can be accomplished by a disproportionation reaction process, for example, as described in the above-identified Patent No. 3,014,820. The n-type GaAs material 25 within troughs 23, since "seeded" by wafer 15, strongly bonds the remaining discrete portions of wafer 15 supported on "stressing" layer 17. Subsequent to the "back-filling" step of FIG. 2D, "stressing" layer 17 can be removed either partially or totally, along with excess portions of the n-type GaAs material 25 by mechanical lapping processes, integrity of the resulting structure shown in FIG. 2E being maintained by the crystallographic bonding between the discrete portions of wafer 15 and "back-filled" n-type GaAs regions 25.

The array of injection lasers is defined by forming a PN-junction in each of the n-type GaAs regions 25 by conventional diffusion or epitaxial processes and, also, mechanically polishing edge surfaces of wafer 15 perpendicular to such junctions to define Fabry-Perot mirrors. For example, subsequent to the removal, or partial removal, of "stressing" layer 17, surface 27 of wafer 15 is exposed to an appropriate dopant atmosphere at an elevated temperature. For example, zinc may be diffused into wafer 15 from surface 27 as shown by dotted line 29 to defined a PN-junction 31 in n-type GaAs regions 25. Since diffusion is effected into those portions of n-type GaAs regions 25 having minimum width dimensions, the width dimensions of the resulting PN-junctions 31 are very substantially reduced over prior art techniques and variations in junction temperature $T_j$ are minimized since heat is more readily dissipated from along such junctions into the semi-insulating wafer 15. To complete such array, appropriate contacts 33 and 35 are metallized over the opposing surfaces of wafer 15, as illustrated in FIG. 2F, and connected to a current source 37 to support forward current across PN-junctions 31 sufficient to achieve an inverted charge-carrier population whereby current carriers recombine in the predominant mode to support laser operation. If epitaxial processes are employed, "stressing" layer 17 is totally removed and a layer of p-type semiconductor material, e.g., GaAs, is deposited over surface 27 to defined a PN-junction with each of the n-type GaAs regions 25.

Figures 3A, 3B, 3C:
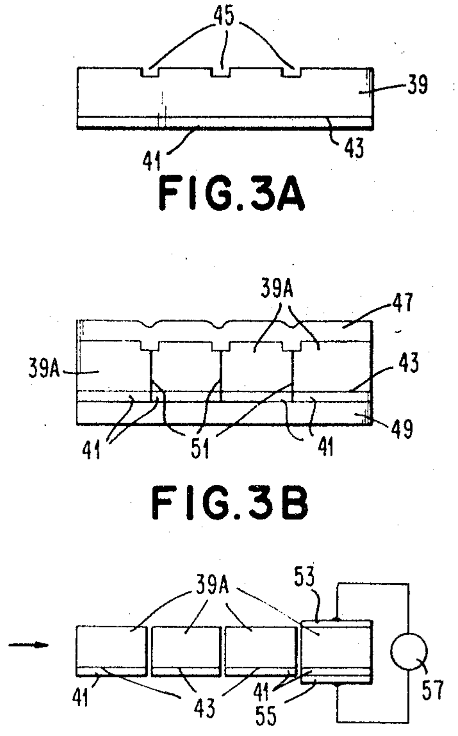
FIGS. 3A–3C illustrate the various process steps for dissecting a semiconductor wafer into distinct crystalline bodies having at least two optically parallel surfaces.

An alternate technique is illustrated in FIGS. 3A through 3C for forming fabricating discrete injection laser devices. As illustrated in FIG. 3A, a wafer 39, for example, of n-type [110] oriented GaAs material, includes a narrow surface region 41 of p-type material, for example, formed by conventional diffusion processes, disproportionation reaction processes, etc., to define PN-junction 43. PN-junction 43 is representative of two or more junctions which may be found in wafer 39, for example, to fabricate dissect three-level or four-level active semiconductor devices. A number of spaced-parallel channels 45 having a substantially rectangular cross section are formed in the opposite surface of wafer 39 and oriented along the [110] crystallographic plane; channels 45 can be formed, for example, by conventional chemical etching or ultrasonic impact grinding processes. Channels 45, in effect, reduce the thickness of selected portions of wafer 39 to reduce the binding forces in particular [110] cleavage planes and more positively control the promotion of fissures. Wafer 39 is positioned in housing 1 of FIG. 1 and "stressing" layers 47 and 49, as shown in FIG. 3B, are deposited on opposite major surfaces of wafer 39. Again, at the completion of the deposition process, the structure of FIG. 3B is at an elevated temperature, i.e., 850° C. Since the coefficient of linear expansion of wafer 39 is greater than the coefficient of linear expansion of "stressing" layers 47 and 49, wafer 39 contracts to a greater degree than do "stressing" layers 47 and 49. Accordingly, wafer 39 is subjected to a stressing force perpendicular to the natural cleavage planes [110]. As illustrated in FIG. 3B, fissures 51 are produced along portions of wafer 39 of reduced thickness, the provisions of "stressing" layers 47 and 49 insuring that such fissures extended through so as to dissect wafer 39 and define a number of distinct crystalline bodies 39A. Since fissures 51 occur along the natural cleavage planes [110] of wafer 39, opposing surfaces of the individual crystalline bodies 39A thus defined are optically flat and suitable to define a Fabry-Perot optical cavity. When fissures 51 have been produced, the resulting bodies 39A may be dissassociated by mechanically lapping-off "stressing" layers 47 and 49 below the level of channels 45. When the discrete crystalline bodies 39A have been dissassociated as shown in FIG. 2D, each body can be further dissected by a conventional string cutter, such cuts begin nonreflecting and made in a direction perpendicular to the "cleaved" surfaces, as shown by the arrow, for alignment of the Fabry-Perot plates or at a selected angle for particular optical property enhancement. Individual injection laser devices are then completed by forming ohmic contacts 53 and 55 over opposite surfaces of the individual crystalline bodies, as further shown in FIG. 2C, to which a current source 57 can be connected to support the laser action.

While the invention has been particularly shown and described with references to preferred embodiments thereof, it will be understood by those skilled in the art that various changes in form and details may be made therein without departing from the spirit and scope of the invention.

What is claimed is:

1. A process for producing a fissure in a crystalline body comprising the steps of forming a laminate structure of a layer of stressing material and a crystalline body exhibiting a natural cleavage plane, said stressing material and said crystalline body exhibiting different coefficients of linear expansion, and varying the temperature of said laminate structure to induce stresses in said crystalline body sufficient to overcome bonding forces along said cleavage plane and produce a fissure therealong.

2. A process for preforming the surface of a crystalline body having a natural cleavage plane defined in its lattice structure comprising the steps of bonding a first layer of stressing material over at least one surface of said crystalline body to define a laminate structure, said stressing material having a coefficient of linear expansion different from that of said crystalline body, and varying the temperature of said laminate structure to induce stresses in said crystalline body sufficient to overcome bonding forces along said cleavage plane and produce a fissure therealong.

3. The process as defined in claim 2 including the further step of bonding a second layer of said stressing material over another surface of said crystalline body opposite said one surface.

4. The process as defined in claim 2 including the further step of defining a channel along said one surface and oriented along said cleavage plane prior to the bonding of said first layer of stressing material.

5. The process as defined in claim 2 including the further step of exposing said laminate structure to an etchant selective with respect to said crystalline body whereby said one surface of said crystalline body is preformed to define a trough.

6. The process as defined in claim 2 including the further step of forming said crystalline body of gallium arsenide and said stressing layer of gallium phosphide: arsenide.

7. The process as defined in claim 2 including the further step of exposing said laminate structure to an etchant selective with respect to said crystalline body for a time at least sufficient to etch through said crystalline body and along said fissure so as to expose a portion of said first layer of stressing material at the interface therebetween and said crystalline body.

8. The process as defined in claim 7 including the further step of forming said crystalline body of a semi-insulating semiconductor material, and depositing a semiconductor material of given conductivity type to backfill said trough defined in said crystalline body.

9. The process as defined in claim 8 including the further steps of forming a PN-junction in said backfilled semiconductor material, and polishing the edge surface of said crystalline body perpendicular to said PN-junction to define Fabry-Perot mirrors.

10. The process as defined in claim 8 including the further step of removing at least a portion of said stressing layer from said one surface of said crystalline body, and diffusing an opposite conductivity type-inducing impurity into said backfilled semiconductor material at said one surface of said crystalline body to define a PN-junction.

11. The process as defined in claim 8 including the further step of removing said stressing layer from said one surface of said crystalline body, and depositing a layer of semiconductor material of opposite conductivity type over said one surface of said crystalline body to define a PN-junction with said backfilled semiconductor material.

12. A process for preforming the surface of a crystalline body having a natural cleavage plane defined in its lattice structure comprising the steps of depositing a first layer of stressing material over at least one surface of said crystalline body to define a laminate structure, said crystalline body having a coefficient of linear expansion greater than that of said stressing material, and reducing the temperature of said laminate structure, the difference in the respective coefficients of linear expansion of said crystalline body and said stressing material being such as to induce stresses in said crystalline body sufficient to produce a fissure along said natural cleavage plane.

13. The process as defined in claim 12 including the further step of maintaining said crystalline body at a first temperature elevated above room temperature while depositing said first layer of stressing material, reducing the temperature of said laminate structure to room temperature subsequent to the deposition of said first layer of stressing material to produce said fissure.

14. A process for preforming the surface of a crystalline body having a particular set of natural cleavage planes defined in its lattice structure comprising the steps of depositing a first layer of stressing material over at least one surface of said crystalline body to define a laminate structure, said crystalline body having a coefficient of linear expansion greater than said stressing material, and reducing the temperature of said laminate structure, the difference in said respective coefficients of linear expansion of said crystalline body and said stressing material being such as to subject said crystalline body to stressing forces, said crystalline body being oriented to subject said particular set of natural cleavage planes defined in said lattice structure to said stressing forces, said stressing forces being sufficient to overcome the bonding forces along said natural cleavage planes to induce fissures therealong.

15. A process for defining a number of crystalline bodies from a crystalline wafer having a set of natural cleavage planes defined in its lattice structure comprising the steps of depositing a first layer of stressing material over at least one surface of said crystalline wafer to define a laminate structure, said crystalline wafer having a coefficient of linear expansion different from that of said stressing material, varying the temperature of said laminate structure to induce stressing forces along said cleavage planes in said crystalline wafer sufficient to overcome the bonding energy along said cleavage planes, and removing said stressing layer so as to cause said crystalline wafer disassociate into said plurality of distinct crystalline bodies.

16. The process as defined in claim 15 including the further steps of depositing a second layer of said stressing material on another surface of said crystalline wafer opposite said first surface, and removing said first and said second layers of stressing material to cause said crystalline wafer to disassociate into said distinct crystalline bodies.

17. The process as defined in claim 15 including the further steps of forming said crystalline wafer of a semiconductor material, and initially defining at least one PN-junction in said crystalline wafer.

18. The process as defined in claim 15 including the further steps of forming said crystalline wafer of a semiconductor material, defining at least one PN-junction in said crystalline wafer prior to bonding of said first layer of stressing material, and dissecting said distinct bodies thus produced to define distinct PN-junction devices said natural cleavage planes being perpendicular to said surface.

19. The process as defined in claim 15 including the further steps of defining a number of parallel-spaced channels on said one surface of said crystalline wafer and oriented along said cleavage planes to control the dimension of said crystalline bodies.

References Cited

UNITED STATES PATENTS

| | | | |
|---|---|---|---|
| 3,311,963 | 4/1967 | Abe | 148—1.5 |
| 3,349,475 | 10/1967 | Marinace | 148—1.5 |

L. DEWAYNE RUTLEDGE, Primary Examiner

R. A. LESTER, Assistant Examiner

U.S. Cl. X.R.

23—223.5; 29—412, 423, 582; 117—201; 148—1.5, 1.6, 186